(12) United States Patent
Song et al.

(10) Patent No.: US 11,672,163 B2
(45) Date of Patent: Jun. 6, 2023

(54) DISPLAY DEVICE MANUFACTURING APPARATUS AND METHOD OF MANUFACTURING DISPLAY DEVICE USING THE SAME

(71) Applicant: Samsung Display Co., LTD., Yongin-si (KR)

(72) Inventors: Min Chul Song, Suwon-si (KR); Jong Woo Park, Seongnam-si (KR); Kyung Hae Lee, Asan-si (KR); Sang Won Jeong, Daejeon (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 284 days.

(21) Appl. No.: 16/799,906

(22) Filed: Feb. 25, 2020

(65) Prior Publication Data

US 2020/0395546 A1    Dec. 17, 2020

(30) Foreign Application Priority Data

Jun. 14, 2019    (KR) .......................... 10-2019-0071020

(51) Int. Cl.
*H01L 51/56*    (2006.01)
*H01L 51/00*    (2006.01)

(52) U.S. Cl.
CPC .......... *H01L 51/0026* (2013.01); *H01L 51/56* (2013.01)

(58) Field of Classification Search
CPC ... H01L 51/56; H01L 51/0026; G02F 1/1303; H05K 3/323; G01K 13/00; G05K 3/323
See application file for complete search history.

(56) References Cited

U.S. PATENT DOCUMENTS

| 2017/0229417 A1* | 8/2017 | Yamaguchi | ............. H01L 24/29 |
| 2017/0254503 A1* | 9/2017 | Gasworth | ............... F21S 45/33 |
| 2019/0003899 A1 | 1/2019 | Inagawa | |

FOREIGN PATENT DOCUMENTS

| JP | 2005347506 A | 12/2005 |
| KR | 10-1910855 B1 | 10/2018 |

* cited by examiner

*Primary Examiner* — Caridad Everhart
(74) *Attorney, Agent, or Firm* — Cantor Colburn LLP

(57) ABSTRACT

An apparatus for manufacturing a display device, includes: a heater which generates heat; a pressing member which contacts a target object of a display device to transfer the heat to the target object; a body connected to each of the heater and the pressing member and through which the heat from the heater is provided to the pressing member; and a first housing cover extended from the body to surround the pressing member and the body in a plan view. Engagement of the first housing cover with the target object defines an internal space of the first housing cover having a temperature, and measurement by the apparatus, of the temperature of the internal space, controls bonding of layers of the target object to each other.

21 Claims, 14 Drawing Sheets

DISPLAY DEVICE MANUFACTURING APPARATUS AND METHOD OF MANUFACTURING DISPLAY DEVICE USING THE SAME

This application claims priority to Korean Patent Application No. 10-2019-0071020 filed on Jun. 14, 2019, and all the benefits accruing therefrom under 35 U.S.C. § 119, the disclosure of which is incorporated herein by reference in its entirety.

BACKGROUND

1. Field

The invention relates to a display device manufacturing apparatus and a method of manufacturing a display device using the same.

2. Description of the Related Art

A display device is a device for visually displaying data. Such a display device includes a substrate divided into a display area and a non-display area. A plurality of pixels are arranged on the substrate in the display area, and a plurality of pads are arranged on the substrate in the non-display area. The plurality of pads are connected with a flexible film (e.g., a chip-on-film ("COF") mounted with a driving circuit and the like to transmit driving signals to the pixels.

The flexible film includes a plurality of leads connected with the plurality of pads, and each of the leads may be bonded to a separate pad. The bonding may be performed through an anisotropic conductive film disposed between the pad and the lead.

In the bonding between the pad and the lead through the anisotropic conductive film, the temperature of the anisotropic conductive film may directly influence bonding reliability.

SUMMARY

An embodiment of the invention provides a display device manufacturing apparatus, in which the pressing temperature of an anisotropic conductive film can be measured in real time during a bonding process.

Another embodiment of the invention provides a method of manufacturing a display device, in which the compression temperature of an anisotropic conductive film can be measured in real time during a bonding process.

According to an embodiment, a display device manufacturing apparatus includes: a heater which generates heat; a pressing member at which the display device manufacturing apparatus contacts a target object of a display device to transfer the heat to the target object; a body connected to each of the heater and the pressing member and through which the heat from the heater is provided to the pressing member; a first housing cover extended from the body to surround the pressing member and the body in a plan view, and a temperature measuring member connected to the first housing cover. The target object includes layers which are bondable to each other, engagement of the first housing cover with the target object defines an internal space of the first housing cover having a temperature defined by heat transferred from the pressing member and the body at the internal space, and measurement by the temperature measuring member, of the temperature of the internal space, controls bonding of the layers of the target object.

The display device manufacturing apparatus may further include: a lower support facing the body; and a second housing cover connected to the lower support and surrounding the lower support in a plan view.

The first housing cover may include a transparent material.

The first housing cover may have a melting point higher than a temperature of the heat supplied from the heating unit.

The first housing cover may include a first sub-housing cover connected to the body, and a second sub-housing cover which is spaced apart from the body with the first sub-housing cover therebetween, and the first sub-housing cover and the second sub-housing cover may include different materials from each other.

Rigidity of the second sub-housing cover may be lower than rigidity of the first sub-housing cover.

The first housing cover may be extended directly from the body.

The first housing cover may be provided as a separate member from the body and attachable to the body.

According to another embodiment, a method of manufacturing a display device includes: providing an anisotropic conductive film of the display device between a target panel of the display device and a target substrate of the display device; covering the anisotropic conductive film which is between the target panel and the target substrate, with a housing cover of an apparatus for manufacturing the display device, to define an internal space of the housing cover to which the anisotropic conductive film is exposed; attaching the target panel to the target substrate through the anisotropic conductive film; and measuring a temperature of the internal space in the housing cover to control attachment of the target panel to the target substrate through the anisotropic conductive film.

The attaching the target panel to the target substrate may include attaching the target panel to the target substrate by applying heat and pressure using a pressing member of the apparatus for manufacturing the display device.

The measuring the temperature in the housing cover may include measuring a saturation temperature in the housing cover.

The temperature of the internal space in the housing cover which is maintained for a period of time may define the saturation temperature, and the measuring the temperature of the internal space in the housing cover may include terminating the attaching of the target panel to the target substrate when the temperature reaches the saturation temperature.

The measuring the temperature of the internal space in the housing cover may include increasing the heat which is applied to the target substrate when the saturation temperature is lower than a reference saturation temperature.

The measuring the temperature of the internal space in the housing cover may include decreasing the heat which applied to the target substrate when the saturation temperature is higher than a reference saturation temperature.

The attaching the target panel to the target substrate may include attaching a signal wiring of the target panel to a lead wiring of the target substrate through the anisotropic conductive film.

The covering the anisotropic conductive film with the housing cover may include contacting the housing cover with the target panel and the target substrate.

The housing cover may include an upper housing cover and a lower housing cover, and the contacting the housing cover with the target panel and the target substrate may include contacting the upper housing cover with the target substrate and contacting the lower housing cover with the target panel.

The upper housing cover may include a first sub-housing cover and a second sub-housing cover disposed under the first sub-housing cover, and the second sub-housing cover may be contacted with the target substrate.

The rigidity of the second sub-housing cover may be lower than the rigidity of the first sub-housing cover.

The housing cover may include a transparent material.

However, features of the invention are not restricted to the one set forth herein. The above and other features of the invention will become more apparent to one of ordinary skill in the art to which the invention pertains by referencing the detailed description of the invention given below.

BRIEF DESCRIPTION OF THE DRAWINGS

The above and other features of the invention will become more apparent by describing in detail exemplary embodiments thereof with reference to the attached drawings, in which.

DETAILED DESCRIPTION

Figure 1:
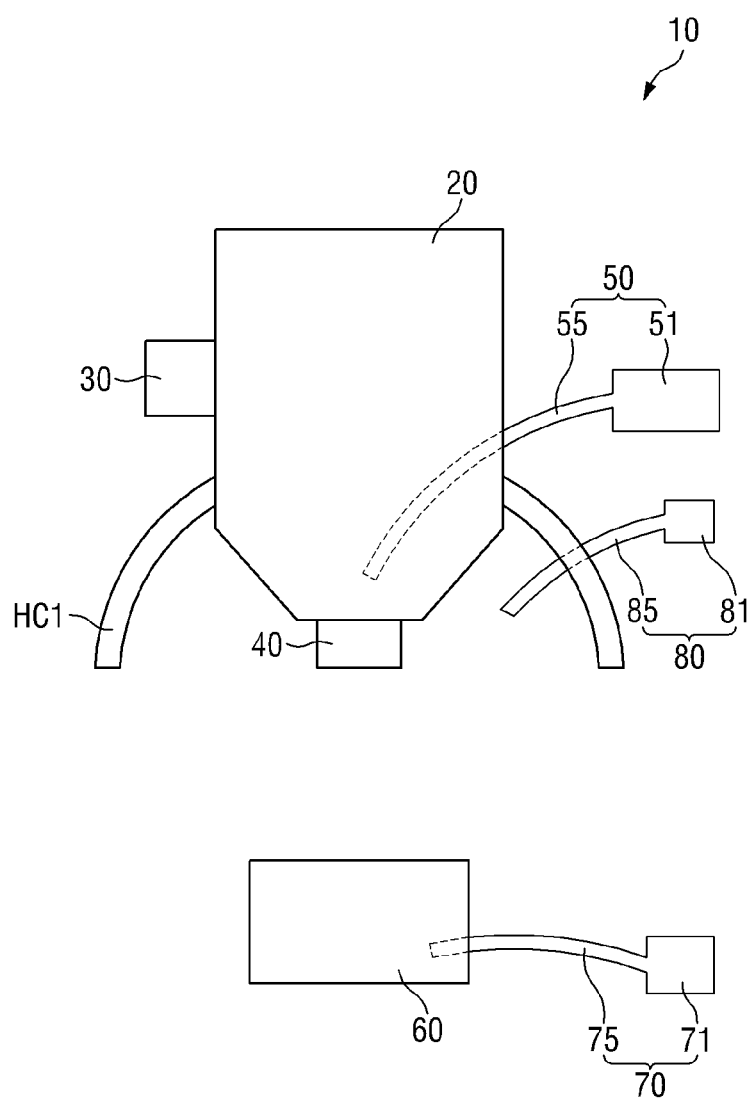
FIG. 1 is a cross-sectional view of an embodiment of a display device manufacturing apparatus.

Specific structural and functional descriptions of embodiments of the invention disclosed herein are only for illustrative purposes of the embodiments of the invention. The invention may be embodied in many different forms without departing from the spirit and significant characteristics of the invention. Therefore, the embodiments of the invention are disclosed only for illustrative purposes and should not be construed as limiting the invention. That is, the invention is only defined by the scope of the claims.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the attached drawings.

Figure 2:
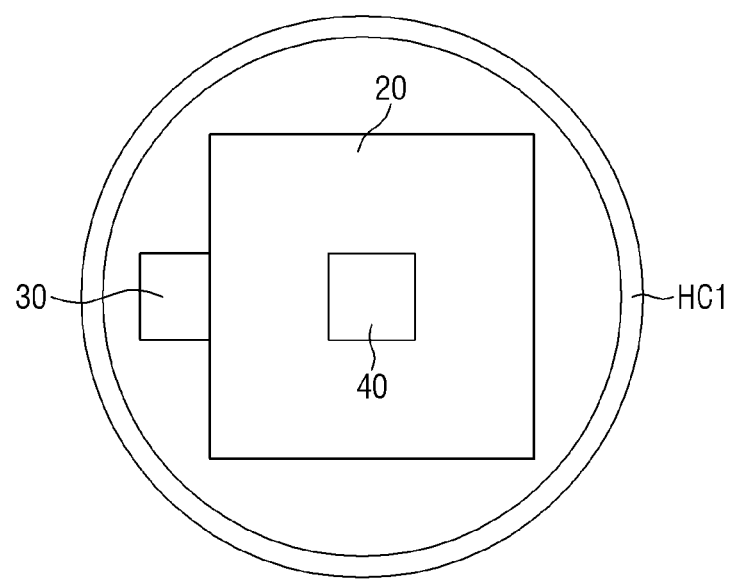
FIG. 2 is a plan view of an embodiment of a lower support and a second housing cover of a display device manufacturing apparatus.

FIG. 1 is a perspective view of an embodiment of a display device manufacturing apparatus 10, and FIG. 2 is a plan view of an embodiment of a lower support 60 and a first housing cover HC1 of a display device manufacturing apparatus 10.

A "plan view" or a "top plan view" may be a view along a direction normal to a plane defined by a first direction and a second direction which cross each other. In FIG. 2, for example, the horizontal direction and the vertical direction may variously represent the first and second directions. A thickness direction of the display device manufacturing apparatus 10, components thereof and/or target objects to be processed by the display device manufacturing apparatus 10 may be defined along a third direction crossing each of the first and second directions. In FIG. 1, for example, the vertical direction may represent the third direction, which the horizontal direction may represent the first direction and/or the second direction.

Figure 9:
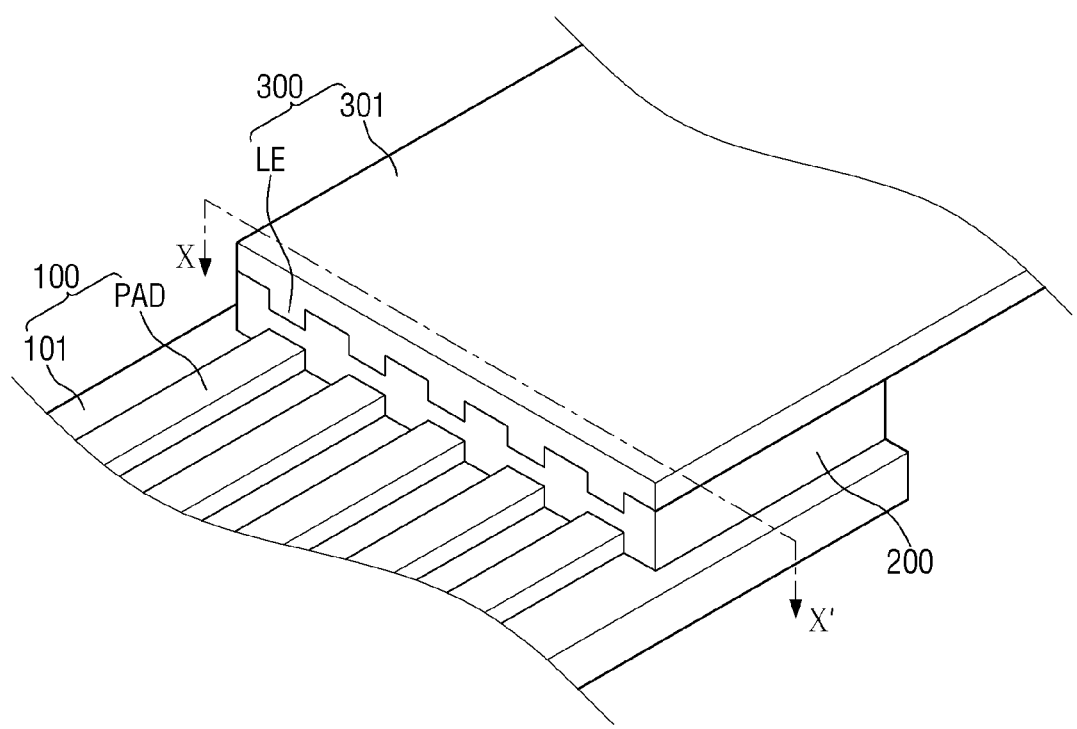
FIG. 9 is a perspective view of an embodiment of a target panel, a target substrate, and an anisotropic conductive film.

A display device manufacturing apparatus 10 may be a bonding apparatus with which a signal wiring of a target panel 100 (FIG. 9) disposed on a junction of a display device is bonded to a lead wiring of a target substrate 300 (FIG. 9). More specifically, in the display device manufacturing apparatus 10, heat and pressure are applied to the target panel and the target substrate to at least partially melt an anisotropic conductive film ("ACF") between the target panel and the target substrate and press the anisotropic conductive film ("ACF") which is melted along a thickness direction, thereby bonding the overlying target substrate and the underlying target panel to each other.

The display device, which is a device for displaying a mobile image or a still image, may be used as or define a display screen of various products such as televisions, notebooks, monitors, billboards, and internet of things, as well as portable electronic appliances such as mobile phones, smart phones, tablet personal computers (tablet "PCs"), smart watches, watch phones, mobile communication terminals, electronic notebooks, electronic books, portable multimedia players ("PMPs"), navigators, and ultra mobile PCs.

In an embodiment, for example, the display device may be at least one of a liquid crystal display ("LCD"), a quantum dot organic light emitting display ("QD-OLED"), a quantum dot liquid crystal display ("QD-LCD"), a quantum nano light emitting display ("NanoLED"), and a micro light emitting display ("micro-LED").

Referring to FIGS. 1 and 2, the display device manufacturing apparatus 10 may include a body 20, a heating unit 30 (e.g., a heater 30), a pressing unit 40 (e.g., a pressing member 40), a first temperature measuring unit 50 (e.g., first temperature measuring member 50), a second temperature measuring unit 70 (e.g., second temperature measuring member 70), a first housing cover HC1, a lower support 60, and a third temperature measuring unit 80 (e.g., third temperature measuring member 80).

The body 20 may serve to support the heating unit 30, the pressing unit 40, the first temperature measuring unit 50, and the first housing cover HC1, which are each connected to the body 20. The body 20 may serve a passage or pathway for transmitting thermal energy provided by the heating unit 30 to the pressing unit 40, which will be described later. The body 20, the heating unit 30, the pressing unit 40, the first temperature measuring unit 50, and the first housing cover HC1, which are physically connected to each other, may be vertically movable along a thickness direction of the display device manufacturing apparatus 10, components thereof and/or a target object which is processed by the display device manufacturing apparatus 10. The body 20, the heating unit 30, the pressing unit 40, the first temperature measuring unit 50 and/or the first housing cover HC1 may be movable together with each other. As will be described later, the body 20, the heating unit 30, the pressing unit 40, the first temperature measuring unit 50, and the first housing cover HC1, which are physically connected to each other, may be movable downward when a bonding process of a target substrate and a target panel starts, and may be movable upward when a bonding process of the target substrate and the target panel ends.

The heating unit 30 may be physically connected to the body 20. Although the heating unit 30 is shown disposed on the side surface of the body 20, the invention is not limited thereto. As described above, the heating unit 30 may generate thermal energy and/or apply thermal energy to the body 20. The heating unit 30 may generate the thermal energy according to a predetermined reference value. However, although a reference value is set with respect to the heating unit 30, the heating unit 30 may generate thermal energy which deviates from the reference value depending on equipment variation of the heating unit 30 and/or in transmitting of the thermal energy to the body 20.

The pressing unit 40 may be connected to the lower end of the body 20. The pressing unit 40 may directly provide heat and pressure to the target substrate to at least partially melt an anisotropic conductive film ("ACF") provided between the target panel and the target substrate, and simultaneously press the anisotropic conductive film ("ACF"), thereby bonding the target substrate as an overlying element and the target panel as an underlying element relative to the anisotropic conductive film ("ACF"). To directly provide heat and pressure, the pressing unit 40 may directly contact one or more of the anisotropic conductive film ("ACF"), the target panel and the target substrate. The anisotropic conductive film ("ACF") provided between the target panel and the target substrate may be pressed together with the target panel and the target substrate.

The first temperature measuring unit 50 may serve to measure the temperature of the body 20 which is defined or generated by thermal energy provided from the heating unit 30 to the body 20. Although it is shown in FIG. 1 that the first temperature measuring unit 50 is physically connected to the body 20, the invention is not limited thereto. In an embodiment, the first temperature measuring unit 50 may be physically connected to the pressing unit 40. The first temperature measuring unit 50 may include a first temperature measuring main portion 51 and a first connection portion 55 which physically connects the first temperature measuring main portion 51 and the body 20 to each other.

The first connection portion 55 may include a material having relatively high thermal conductivity so as to make the actual temperature of the body 20 substantially equal to the temperature measured from or indicated at the first temperature measuring main portion 51. The first connection portion 55 may include a metal material having relatively high thermal conductivity.

The lower support 60 may be disposed under the body 20 and the pressing unit 40 along the thickness direction. The lower support 60 may serve to support the target substrate and the target panel from below, relative to remaining portions of the display device manufacturing apparatus 10. In an embodiment, the lower support 60 may contact the lower surface of the target panel to support the target panel.

The temperature of the lower support 60 may be maintained constant in order to reduce or effectively prevent the thermal energy transmitted to the target substrate and the target panel through the pressing unit 40 from being decreased by the lower support 60 during a bonding process in which the target substrate and the target panel are coupled to each other.

For this purpose, although not shown in the drawings, the display device manufacturing apparatus 10 may further include a lower heating unit connected to the lower support 60. The lower heating unit may generate and/or provide thermal energy to the lower support 60 to maintain the constant temperature thereof.

The second temperature measuring unit 70 may serve to measure whether the temperature of the lower support 60 is maintained constant. The second temperature measuring unit 70 may include a second temperature measuring main portion 71 and a second connection portion 75 which physically connects the second temperature measuring unit 70 and the lower support 60 to each other.

The second connection portion 75 may include a material having relatively high thermal conductivity so as to make the actual temperature of the lower support 60 substantially equal to the temperature measured from or indicated at the second temperature measuring main portion 71. The second connection portion 75 may include a metal material having relatively high thermal conductivity.

In the bonding of the target substrate and the target panel having the anisotropic conductive film ("ACF") therebetween to each other, when the pressing temperature at which the anisotropic conductive film ("ACF") is thermally pressed by the display device manufacturing apparatus 10 is lower than a reference pressing temperature range of the anisotropic conductive film ("ACF"), the anisotropic conductive film ("ACF") is not appropriately melted, and thus the bonding force between the target substrate and the target panel may be weakened.

Further, when the pressing temperature at which the anisotropic conductive film ("ACF") is thermally pressed by the display device manufacturing apparatus 10 is higher than the reference pressing temperature range, the thermal energy provided from the heating unit 30 is higher than a predetermined reference value, and thus excessive power consumption may occur. That is, to provide appropriate melting of the anisotropic conductive film ("ACF") and to minimize excessive power consumption, the pressing temperature at which the anisotropic conductive film ("ACF") is thermally pressed by the display device manufacturing apparatus 10 is controlled or maintained within the reference pressing temperature range.

As described above, even when the heating unit 30 is set to the reference value such that the pressing temperature at which the anisotropic conductive film ("ACF") is thermally pressed by the display device manufacturing apparatus 10 is within the reference pressing temperature range, the heating unit 30 may generate thermal energy having a predetermined deviation from the reference value according to equipment variation and transmission of the thermal energy to the body 20 and/or the pressing unit 40. Even when the heating unit 30 generates thermal energy corresponding to the reference value and transmits the thermal energy to the body 20 and/or the pressing unit 40, the thermal energy transmitted from the pressing unit 40 to the anisotropic conductive film ("ACF") may be changed depending on the shape or material of the pressing unit 40.

For this purpose, the display device manufacturing apparatus 10 may further include a first housing cover HC1 physically connected to the body 20 and entirely covering a bonding area of the target substrate, the target panel, and the anisotropic conductive film ("ACF") during a bonding process. The pressing temperature at which the anisotropic conductive film ("ACF") is thermally pressed by the display device manufacturing apparatus 10 may be indirectly measured by measuring the internal temperature of a space defined by the first housing cover HC1, the target substrate, the target panel, and the anisotropic conductive film ("ACF").

The display device manufacturing apparatus 10 may further include a third temperature measuring unit 80 in order to measure the temperature of the internal space within the first housing cover HC1. The third temperature measuring unit 80 may be physically connected to the first housing cover HC1. The third temperature measuring unit 80 may include a third temperature measuring main portion 81 with which the temperature of the internal space is measurable, and a third connection portion 85 connecting the third temperature measuring main portion 81 and the internal space to each other.

The third connection portion 85 is located in extends into the internal space of the first housing cover HC1 from outside thereof. A temperature of the third connection portion 85 is changeable depending on the temperature of the atmosphere or environment within the internal space. Thermal energy due to the change in the temperature of the third connection portion 85 is transmitted to the third temperature measuring main portion 81 to allow the third temperature measuring main portion 81 to measure the temperature of atmosphere in the internal space.

The third connection portion 85 may include a material having high relatively thermal conductivity so as to make the actual temperature of the atmosphere in the internal space substantially equal to the temperature measured from or indicated at the third temperature measuring main portion 81. The third connection portion 85 may include a metal material having relatively high thermal conductivity.

A bonding area of the target substrate, the target panel and the anisotropic conductive film ("ACF") as target objects, may respectively include a planar area at which one target object among these target objects is coupled to another one of the target objects. As described above, the first housing cover HC1 may entirely cover the bonding area of the target substrate, the target panel, and the anisotropic conductive film ("ACF") during a bonding process. Specifically, the lower end of the first housing cover HC1 (e.g., end closest to the lower support 60 in FIG. 1) may be in direct contact with the target substrate and the target panel, thereby serving to provide an internal space surrounded by the first housing cover HC1, the target substrate, the target panel, and the anisotropic conductive film ("ACF").

Since the first housing cover HC1 is physically connected to the body 20, when the body 20 descends along the thickness direction during a bonding process, the first housing cover HC1 may descend together with the body 20, and thus the first housing cover HC1 may be in direct contact with the target substrate and the target panel.

When thermal energy is introduced into the internal space through the pressing unit 40 of the display device manufacturing apparatus 10, the thermal energy of the body 20 and the pressing unit 40 located in the internal space is discharged through the atmosphere of the internal space, the target substrate and the target panel, so that the temperature of the body 20 which is measured by the first temperature measuring unit 50 is lowered, whereas the temperature of atmosphere in the internal space and the temperature of the anisotropic conductive film ("ACF") exposed to the internal space are raised.

The temperature of the atmosphere in the internal space and the temperature of the anisotropic conductive film ("ACF") may be increased for a predetermined period of time, and then may reach a saturation temperature after the predetermined period of time. Generally, the saturation temperature of the atmosphere in the internal space may be higher because the atmosphere in the internal space is located closer to the pressing unit 40 than the anisotropic conductive film ("ACF").

As will be described later, the saturation temperature of the atmosphere in the internal space and the saturation temperature of the anisotropic conductive film ("ACF") may be empirically determined. Accordingly, the saturation temperature of the anisotropic conductive film ("ACF") during thermal pressing may be measured by measuring the saturation temperature of the atmosphere in the internal space.

That is, since the saturation temperature of the anisotropic conductive film ("ACF") is indirectly measured by measuring the saturation temperature of the atmosphere in the internal space in real time during a bonding process, weakening of the bonding force between the target substrate and the target panel occurring when the pressing temperature at which the anisotropic conductive film ("ACF") is thermally pressed by the display device manufacturing apparatus 10 during the bonding of the target substrate and the target panel to each other is lower than the reference pressing temperature range, is reduced or effectively prevented. Additionally, since the saturation temperature of the anisotropic conductive film ("ACF") is indirectly measured by measuring the saturation temperature of the atmosphere in the internal space in real time during a bonding process, excessive power consumption occurring when the pressing temperature at which the anisotropic conductive film ("ACF") is thermally pressed by the display device manufacturing apparatus 10 is higher than the reference pressing temperature range may also be reduced or effectively prevented. The atmosphere in the internal space may be considered adjacent to the anisotropic conductive film ("ACF") which is exposed to the internal space and the atmosphere thereof.

As shown in the top plan view of FIG. 2, the first housing cover HC1 may cover the body 20, the heating unit 30, and the pressing unit 40 of the display device manufacturing apparatus 10.

Although it is shown in FIG. 2 that the planar shape of the first housing cover HC1 is a circular shape, the invention is not limited thereto, and the planar shape of the first housing cover HC1 may be an elliptical shape.

Further, the invention is not limited thereto, and the first housing cover HC1 may have a planar size capable of covering the bonding area of the target substrate, the target panel, and the anisotropic conductive film ("ACF") without covering all of the body 20 and the heating unit 30 in a top plan view. That is, the display device manufacturing apparatus 10 engaged with the target substrate, the target panel, and the anisotropic conductive film ("ACF") may dispose the bonding areas of the target substrate, the target panel, and the anisotropic conductive film ("ACF") covered by the first housing cover HC1, while a portion of the target substrate, the target panel, and/or the anisotropic conductive film ("ACF") may extend outside the first housing cover HC1 to not be covered thereby.

The first housing cover HC1 may include a material having a melting point higher than a temperature of heat from the heating unit 30, which translates into the temperature of heat transmitted to the body 20 and/or the pressing unit 40 for coupling target objects to each other. In an embodiment, for example, when the temperature of the body 20 and/or the pressing unit 40 measured by the first temperature measuring unit 50 during a bonding process of target objects is within a range of about 230 degrees Celsius (° C.) to about 270° C., the melting point of the constituent material of the first housing cover HC1 may be about 270° C. or higher. However, the invention is not limited thereto, and the first housing cover HC1 may include a plastic material such as polyethylene terephthalate ("PET"), polyimide ("PI"), polycarbonate ("PC"), polyethylene ("PE"), polypropylene ("PP"), polysulfone ("PSF"), polymethylmethacrylate ("PMMA"), triacetylcellulose ("TAC"), or a cycloolefin polymer ("COP"), or a metal material.

In some embodiments, the first housing cover HC1 may include a transparent material. Where the first housing cover HC1 includes a transparent material, even when the first housing cover HC1 covers the bonding area of the target substrate, the target panel, and the anisotropic conductive film ("ACF"), the bonding area thereof may be observable from outside the first housing cover HC1, and thus confirmation of whether or not a portion (e.g., the signal wiring) of the target substrate is aligned with a portion (e.g., the lead wiring) of the target panel may be determined.

Further, the first housing cover HC1 may have first rigidity. As described above, the lower end of the first housing cover HC1 may be disposed in contact with the target panel and the target substrate during the bonding process of the target panel and the target substrate to each other. When the first rigidity of the first housing cover HC1 is remarkably higher than the rigidity of each of the target panel and the target substrate, the target panel and the target substrate may be physically damaged when the lower end of the first housing cover HC1 is in contact with the target panel and the target substrate. In an embodiment, the first rigidity of the constituent material of the first housing cover HC1 is defined such that the target panel and the target substrate are not physically damaged even when the lower end of the first housing cover HC1 is in direct contact with the target panel and the target substrate.

Although the first housing cover HC1 may be integrated with the body 20 to form a single, unitary member, the invention is not limited thereto. In an embodiment, the first housing cover HC1 may extend directly from the body 20 to be considered a portion of the body 20 which is extended from a main portion thereof. In an embodiment, the first housing cover HC1 may be provided as a separate element from the body 20 and attached to the body 20 through an intervening fixing member such as an adhesive tape.

Hereinafter, another embodiment of a display device manufacturing apparatus 11 will be described. In the following embodiment, the same reference numerals as those in the aforementioned embodiment are referred to as the same reference numerals, and a description thereof will be omitted or simplified.

Figure 3:
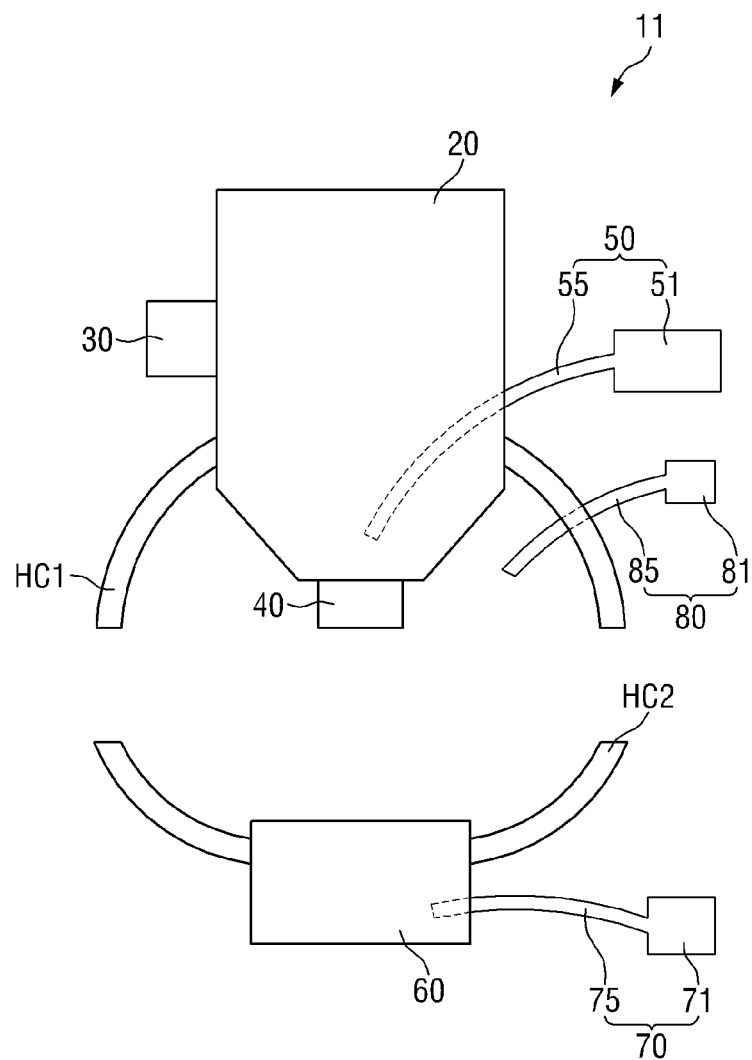
FIG. 3 is a cross-sectional view of another embodiment of a display device manufacturing apparatus.
Figure 4:
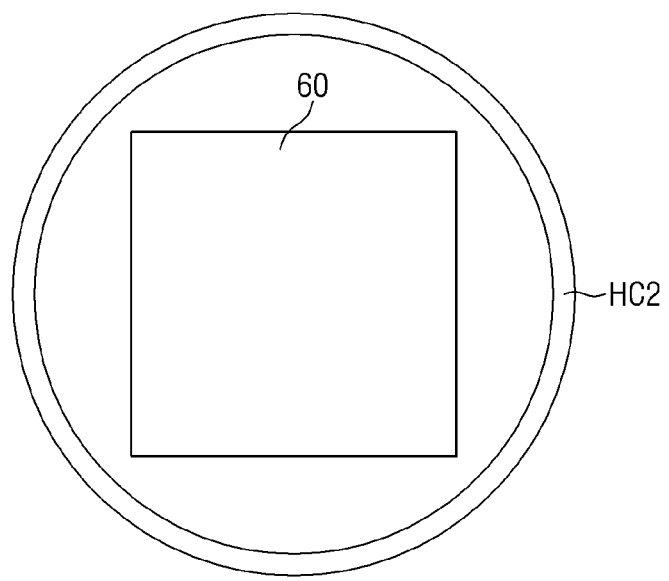
FIG. 4 is a plan view of another embodiment of a lower support and a second housing cover of a display device manufacturing apparatus.

FIG. 3 is a cross-sectional view of an embodiment of a display device manufacturing apparatus 11, and FIG. 4 is a plan view of an embodiment of a lower support 60 and a second housing cover HC2 of a display device manufacturing apparatus 11.

Referring to FIGS. 3 and 4, a display device manufacturing apparatus 11 is different from the display device manufacturing apparatus 10 according to FIG. 1 in that a second housing cover HC2 connected to the lower support 60 is further included.

More specifically, the display device manufacturing apparatus 11 may further include a second housing cover HC2 connected to the lower support 60.

The second housing cover HC2 may entirely cover the bonding area of the target substrate, the target panel, and the anisotropic conductive film ("ACF").

The lower end of the second housing cover HC2 may be in direct contact with the target substrate and the target panel, thereby serving to provide an internal space surrounded by the first housing cover HC1, the target substrate, the target panel, the anisotropic conductive film ("ACF"), and the second housing cover HC2.

Since the first housing cover HC1 is physically connected to the body 20, when the body 20 descends along the thickness direction during a bonding process, the first housing cover HC1 may descend together with the body 20, and thus the first housing cover HC1 may be positioned in direct contact with the target substrate and the target panel. Wince the second housing cover HC2 is connected to the lower support 60, a bonding process may start with the second housing cover HC2 positioned in contact with the target substrate and the target panel without vertically movement of the second housing cover HC2 relative to the target substrate and the target panel.

Since the display device manufacturing apparatus 11 further includes the second housing cover HC2 at the lower portion of the bonding area of the target substrate, the target panel, and the anisotropic conductive film ("ACF") in addition to the first housing cover HC1 at the upper portion of the bonding area thereof, the temperature of the atmosphere in the internal space and the temperature of the anisotropic conductive film ("ACF") may relatively rapidly reach the saturation temperature.

Even in this embodiment, since the saturation temperature of the anisotropic conductive film ("ACF") is indirectly measured by measuring the saturation temperature of the atmosphere in the internal space in real time during bonding process, weakening of the bonding force between the target substrate and the target panel occurring when the pressing temperature at which the anisotropic conductive film ("ACF") is thermally pressed by the display device manufacturing apparatus 11 during the bonding of the target substrate and the target panel to each other is lower than the reference pressing temperature range, is reduced or effectively prevented. Additionally, since the saturation temperature of the anisotropic conductive film ("ACF") is indirectly measured by measuring the saturation temperature of the atmosphere in the internal space in real time during bonding process, excessive power consumption occurring when the pressing temperature at which the anisotropic conductive film ("ACF") is thermally pressed by the display device manufacturing apparatus 11 is higher than the reference pressing temperature range may be reduced or effectively prevented.

As shown in FIG. 4, the second housing cover HC2 may cover the lower support 60 of the display device manufacturing apparatus 11 in a plan view.

Although the planar shape of the second housing cover HC2 shown in FIG. 4 is a circular shape, the invention is not limited thereto, and the planar shape of the second housing cover HC2 may be an elliptical shape.

Further, the invention is not limited thereto, and the second housing cover HC2 may have a planar size capable of covering the bonding area of the target substrate, the target panel, and the anisotropic conductive film ("ACF") without covering an entirety of the lower support 60 in a top plan view. That is, the display device manufacturing apparatus 11 engaged with the target substrate, the target panel, and the anisotropic conductive film ("ACF") may dispose the bonding areas of the target substrate, the target panel, and the anisotropic conductive film ("ACF") covered by the second housing cover HC2, while a portion of the target substrate, the target panel, and/or the anisotropic conductive film ("ACF") may extend outside the second housing cover HC2 to not be covered thereby.

Similarly to the first housing cover HC1, the second housing cover HC2 may include a material having a melting point higher than the temperature transmitted to the body 20 and/or the pressing unit 40 for coupling target objects to each other.

In some embodiments, the second housing cover HC2 may include a transparent material. Where the second housing cover HC2 includes a transparent material, even when the second housing cover HC2 covers the bonding area of the target substrate, the target panel, and the anisotropic conductive film ("ACF"), the bonding area thereof may be observable from outside the second housing cover HC2, and thus confirmation of whether or not a portion (e.g., the signal wiring) of the target substrate is aligned with a portion (e.g., the lead wiring) of the target panel may be determined.

Further, the second housing cover HC2 may have second rigidity. As described above, the upper end of the second housing cover HC2 is in contact with the target panel and the target substrate during the bonding process of the target panel and the target substrate to each other. When the second rigidity of the second housing cover HC2 is remarkably higher than the rigidity of each of the target panel and the target substrate, the target panel and the target substrate may be physically damaged when the upper end of the second housing cover HC2 is in contact with the target panel and the target substrate. In an embodiment, the second rigidity of the constituent material of the second housing cover HC2 is defined such that the target panel and the target substrate are not physically damaged even when the upper end of the second housing cover HC2 is in direct contact with the target panel and the target substrate.

Although the second housing cover HC2 may include the same material as the first housing cover HC1, the invention is not limited thereto, and the second housing cover HC2 may include a different material from the first housing cover HC1.

Figure 5:
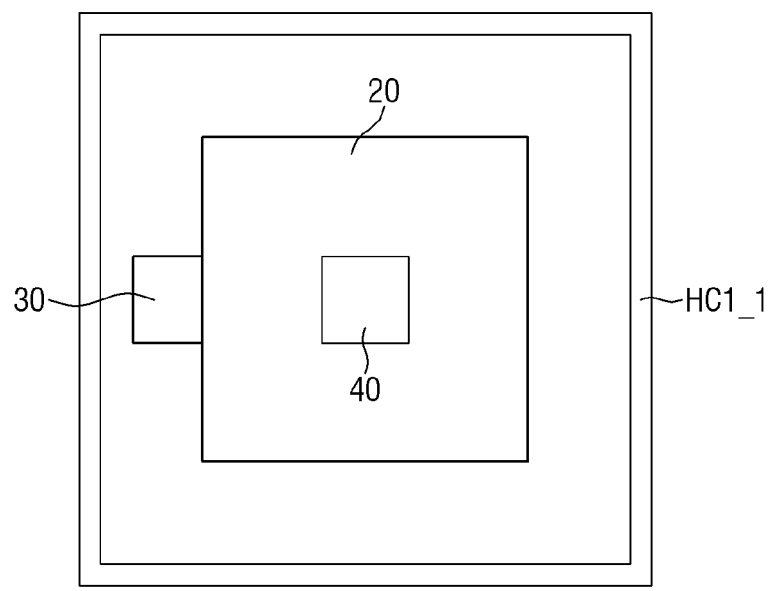
FIG. 5 is a plan view of a modified embodiment of a display device manufacturing apparatus.

FIG. 5 is a plan view of a modified embodiment of a display device manufacturing apparatus 10.

Referring to FIG. 5, the planar shape of a first housing cover HC1_1 of the modified embodiment of the display device manufacturing apparatus 10 is different from the planar shape of the first housing cover HC1 of the display device manufacturing apparatus 10 in FIG. 2.

More specifically, the planar shape of a first housing cover HC1_1 of the modified embodiment of the display device manufacturing apparatus 10 may be a rectangular shape. However, the invention is not limited thereto, and the planar shape of the first housing cover HC1_1 may be another rectilinear shape such as a square shape, a triangular shape, and other polygonal shapes.

Figure 6:
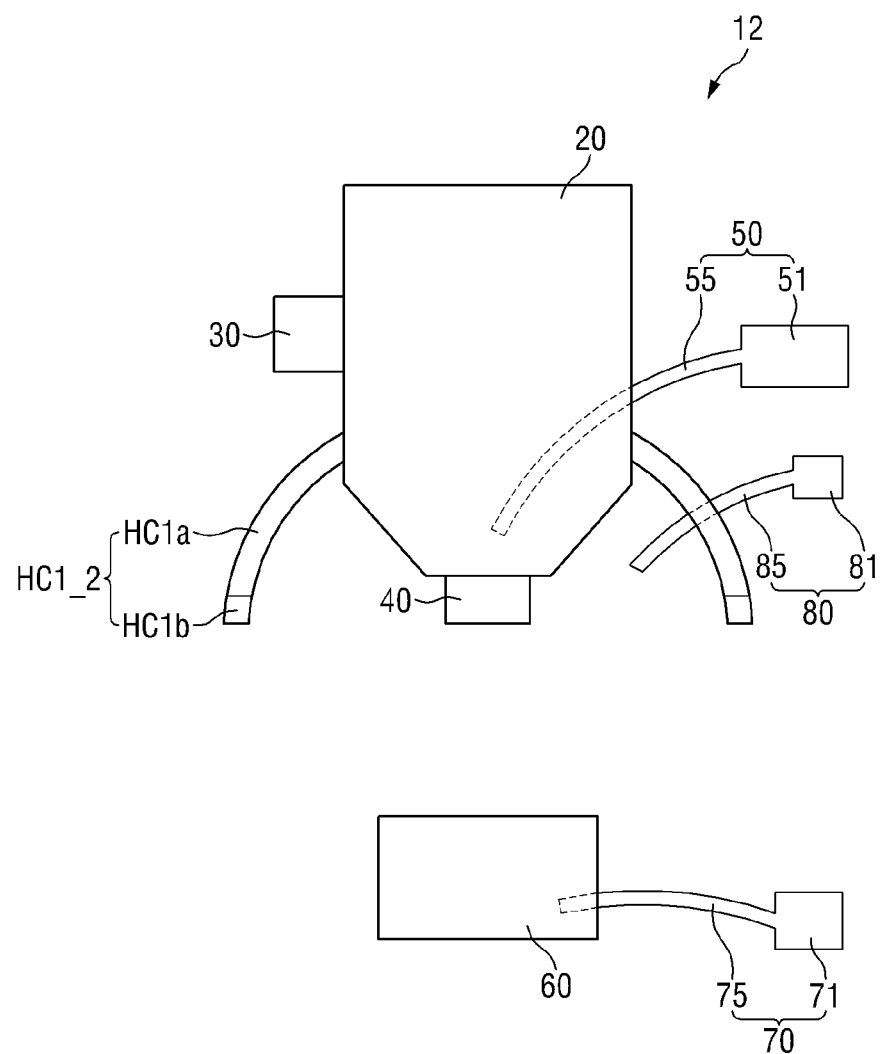
FIG. 6 is a cross-sectional view of still another embodiment of a display device manufacturing apparatus.

FIG. 6 is a cross-sectional view of still another embodiment of a display device manufacturing apparatus 12.

Referring to FIG. 6, a display device manufacturing apparatus 12 is different from the display device manufacturing apparatus 10 of FIG. 1, in that a first housing cover HC1_2 is divided into portions having different materials from each other.

More specifically, the first housing cover HC1_2 may be divided into two portions having different materials from each other. In an embodiment, for example, as shown in FIG. 6, the first housing cover HC1_2 may include a first sub-housing cover HC1a having the first rigidity and a second sub-housing cover HC1b having a third rigidity. The first sub-housing cover HC1a may be physically connected to the body 20, and the second sub-housing cover HC1b may be spaced apart from the body 20 with the first sub-housing cover HC1a therebetween. The second sub-housing cover HC1b may be physically connected to the first sub-housing cover HC1a. The second sub-housing cover HC is extended from an end of the first sub-housing cover HC1a to be spaced apart from the body 20 with the first sub-housing cover HC1a therebetween. The second sub-housing cover HC may constitute a lower end portion (e.g., distal end) of the first housing cover HC1_2. The first sub-housing cover HC1a may be a remaining portion of the first housing cover HC1_2 except for the second sub-housing cover HC1b.

The third rigidity of the second sub-housing cover HC1b may be lower than the first rigidity of the first sub-housing cover HC1a.

The lower end portion of the first housing cover HC1_2, that is, the second sub-housing cover HC1b, is in contact with the target panel and the target substrate during the bonding process of the target panel and the target substrate. That is, engagement of the first housing cover HC1 with the target panel and the target substrate contacts the second sub-housing cover HC1b with the target panel and the target substrate. Since the second sub-housing cover HC1b has the third rigidity lower than the first rigidity of the first sub-housing cover HC1a, physical damage to the target panel and the target substrate when the lower end of the second sub-housing cover HC1b is in contact with the target panel and the target substrate, may be reduced or effectively prevented.

The second sub-housing cover HC1b may include, for example, but is not limited to, sponge or styrofoam.

Since the saturation temperature of the anisotropic conductive film ("ACF") is indirectly measured by measuring the saturation temperature of the atmosphere in the internal space in real time during a bonding process, weakening of the bonding force between the target substrate and the target panel occurring when the pressing temperature at which the anisotropic conductive film ("ACF") is thermally pressed by the display device manufacturing apparatus 12 during the bonding of the target substrate and the target panel to each other is lower than the reference pressing temperature range, may be reduced or effectively prevented. Additionally, since the saturation temperature of the anisotropic conductive film ("ACF") is indirectly measured by measuring the saturation temperature of the atmosphere in the internal space in real time during the bonding process, excessive power consumption occurring when the pressing temperature at which the anisotropic conductive film ("ACF") is thermally pressed by the display device manufacturing apparatus 12 is higher than the reference pressing temperature range, may be reduced or effectively prevented.

Figure 7:
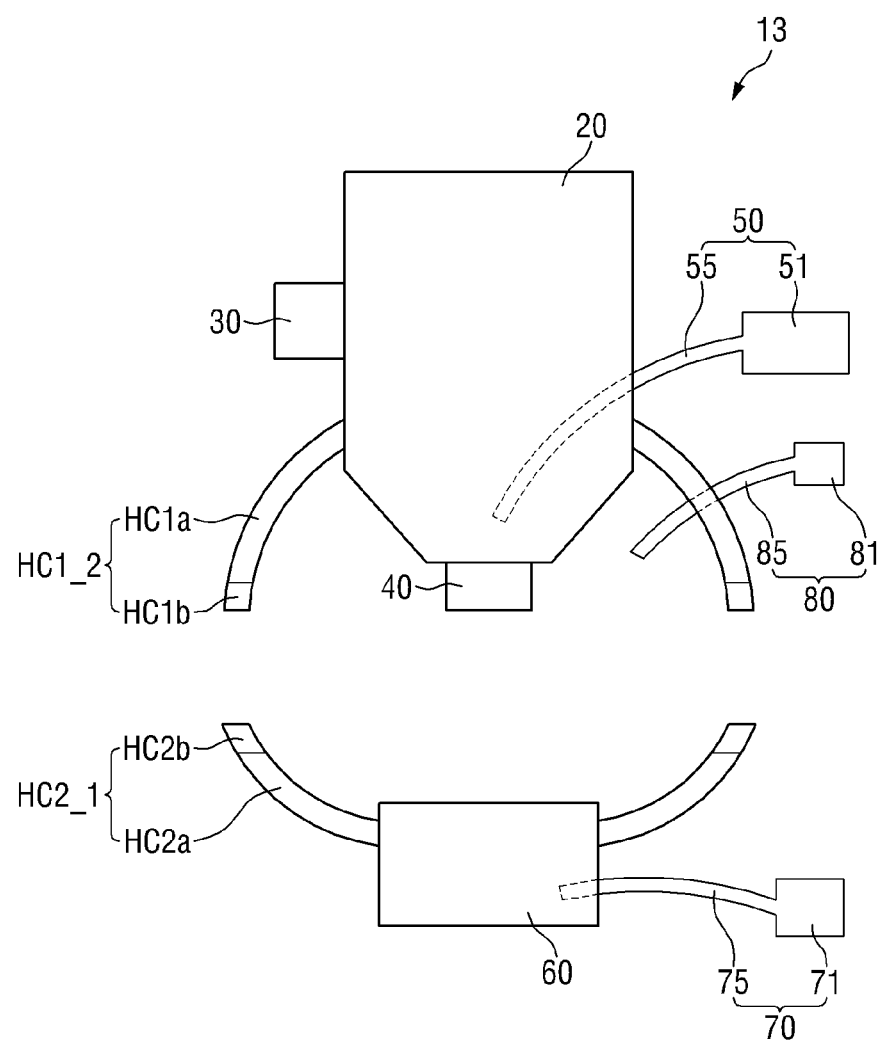
FIG. 7 is a cross-sectional view of yet another embodiment of a display device manufacturing apparatus.

FIG. 7 is a cross-sectional view of yet another embodiment of a display device manufacturing apparatus 13.

Referring to FIG. 7 a display device manufacturing apparatus 13 is different from the display device manufacturing apparatus 12 of FIG. 6 in that a second housing cover HC2_1 is divided into portions having different materials from each other.

More specifically, the second housing cover HC2_1 may be divided into two portions having different materials from each other. In an embodiment, for example, as shown in FIG. 7, the second housing cover HC2_1 may include a third sub-housing cover HC2a having the second rigidity and a fourth sub-housing cover HC2b having a fourth rigidity. The third sub-housing cover HC2a may be physically connected to the lower support 60, and the fourth sub-housing cover HC2b may be spaced apart from the lower support 60 with the third sub-housing cover HC2a therebetween. The fourth sub-housing cover HC2b may be physically connected to the third sub-housing cover HC2a. The fourth sub-housing cover HC2b may constitute a lower end portion of the second housing cover HC2_1. The third sub-housing cover HC2a may be a remaining portion of the second housing cover HC2_1 except for the fourth sub-housing cover HC2b.

The fourth rigidity of the fourth sub-housing cover HC2b may be lower than the second rigidity of the third sub-housing cover HC2a.

The upper end portion of the second housing cover HC2_1, that is, the fourth sub-housing cover HC2b, is in contact with the target panel and the target substrate during the bonding process of the target panel and the target substrate. Since the fourth sub-housing cover HC2b has the fourth rigidity lower than the second rigidity of the third sub-housing cover HC2a, physical damage to the target panel and the target substrate when the upper end of the second sub-housing cover HC1b is disposed in contact with the target panel and the target substrate, may be reduced or effectively prevented.

The fourth sub-housing cover HC2b may include, for example, but is not limited to, sponge or styrofoam.

Since the saturation temperature of the anisotropic conductive film ("ACF") is indirectly measured by measuring the saturation temperature of the atmosphere in the internal space in real time during a bonding process, weakening of the bonding force between the target substrate and the target panel occurring when the pressing temperature at which the anisotropic conductive film ("ACF") is thermally pressed by the display device manufacturing apparatus 13 during the bonding of the target substrate and the target panel to each other is lower than the reference pressing temperature range, is reduced or effectively prevented. Additionally, excessive power consumption occurring when the pressing temperature at which the anisotropic conductive film ("ACF") is thermally pressed by the display device manufacturing apparatus 13 during the bonding of the target substrate and the target panel to each other is higher than the reference pressing temperature range, is reduced or effectively prevented.

Figure 8:
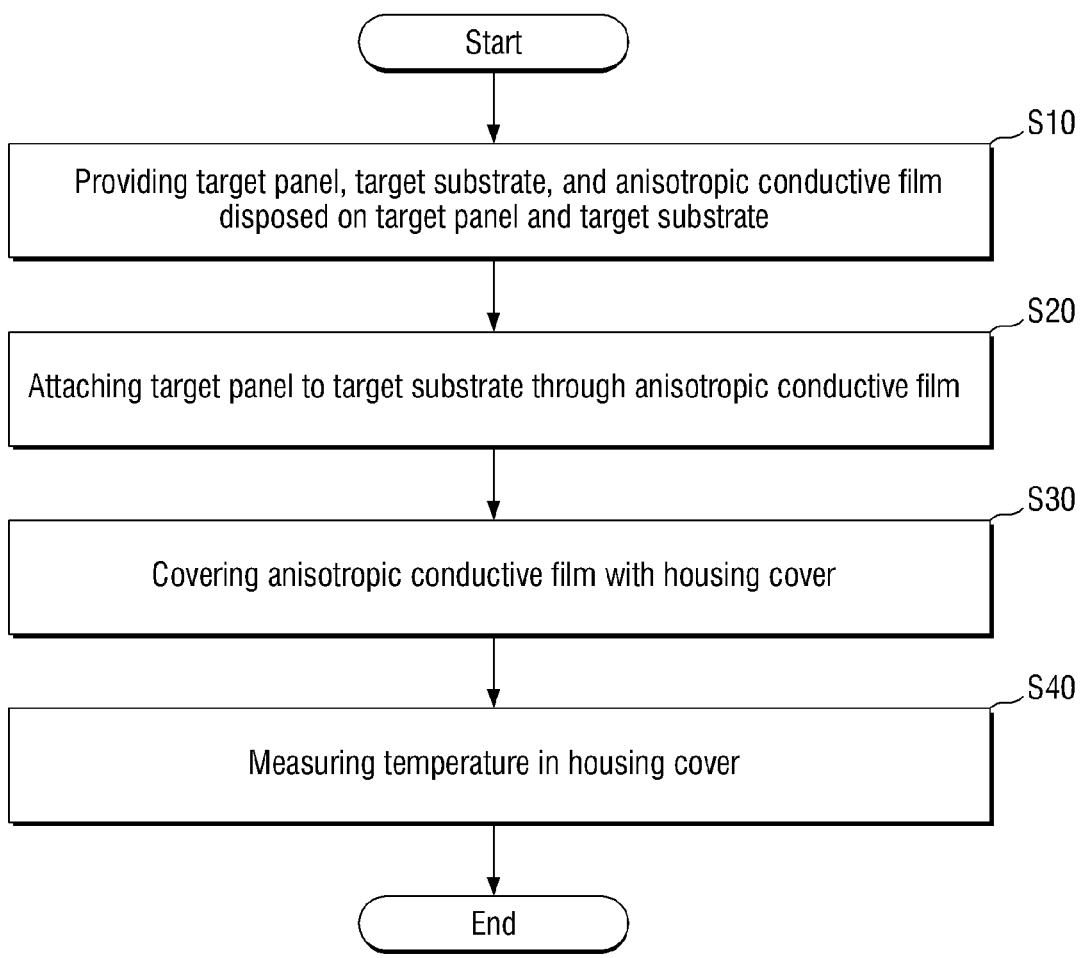
FIG. 8 is a flowchart of an embodiment of a method of manufacturing a display device.
Figure 10A:
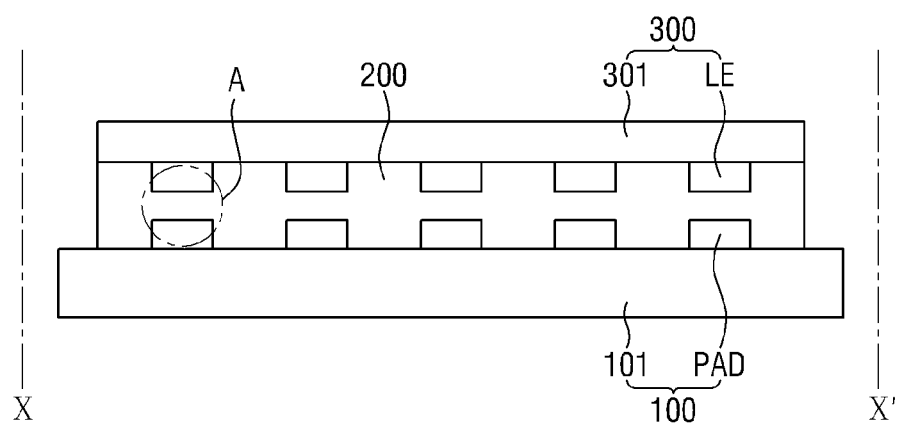
FIG. 10A is a cross-sectional view taken along line X-X' of FIG. 9.
Figure 10B:
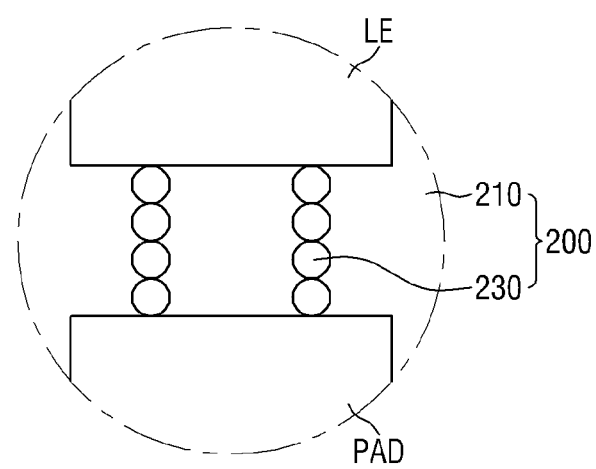
FIG. 10B is an enlarged cross-sectional view of portion A in FIG. 10A.
Figure 12:
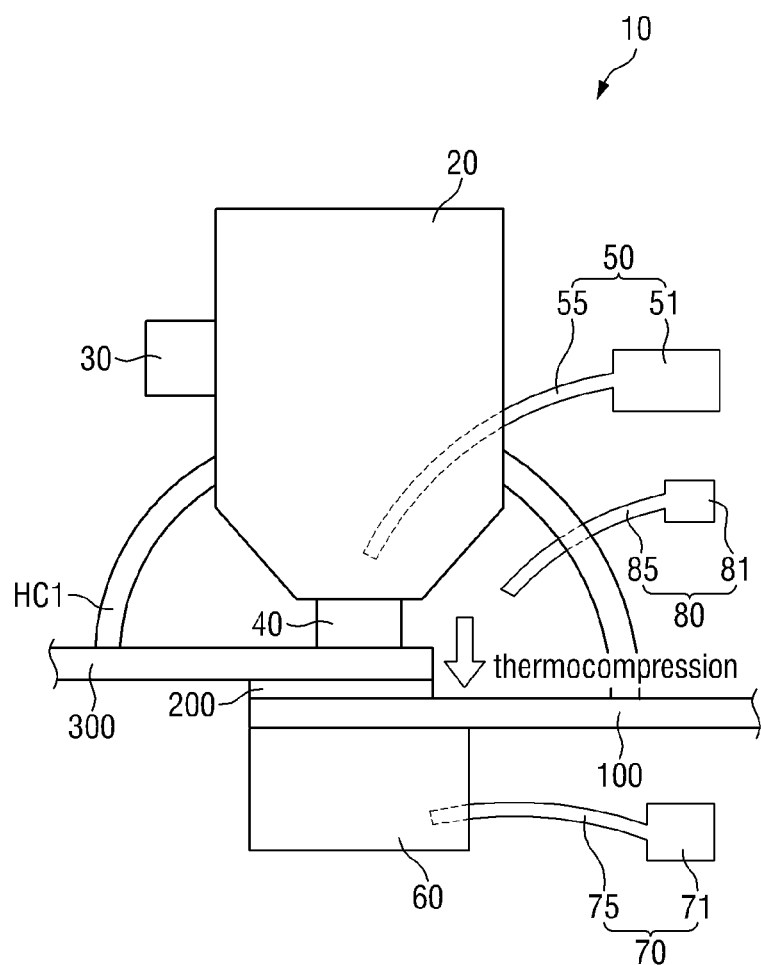
Figure 13:
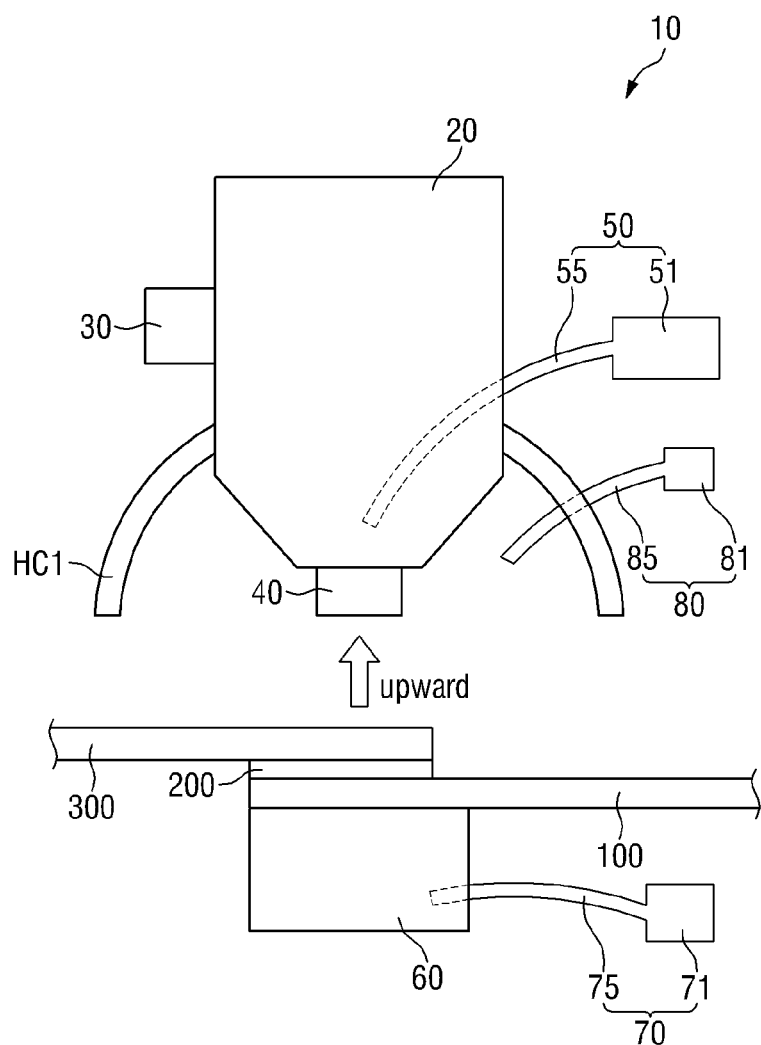
Figure 14:
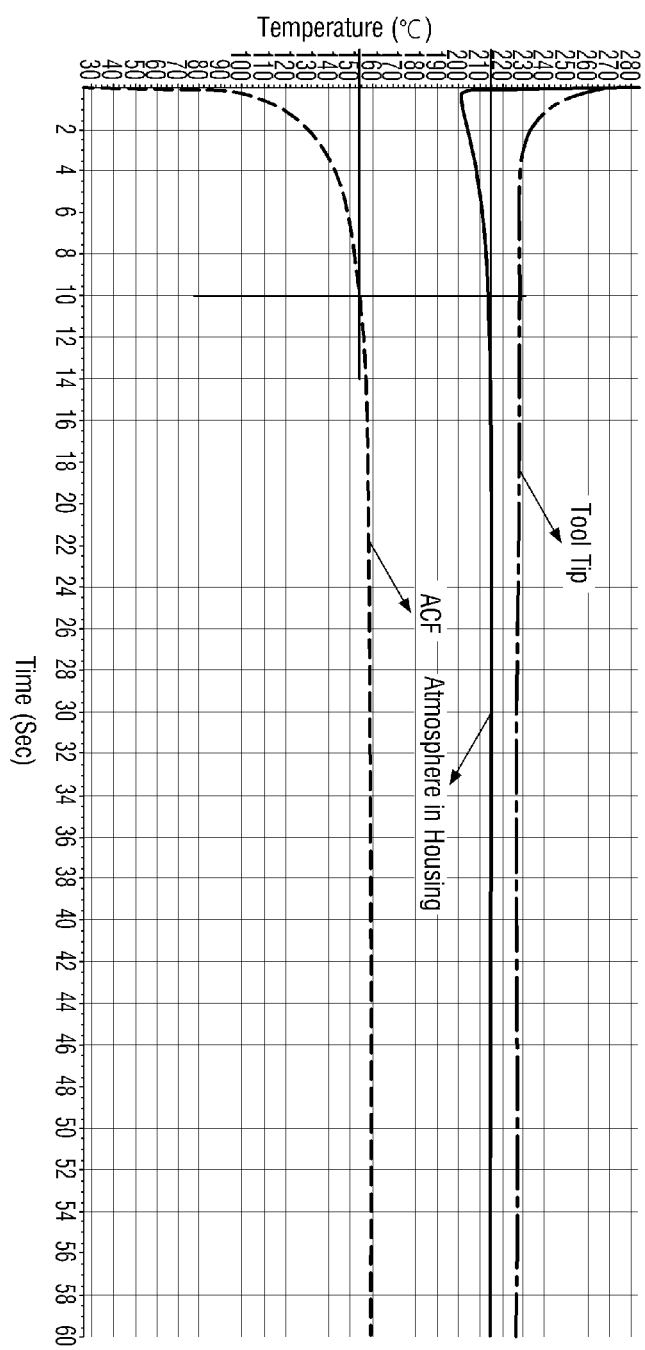
FIG. 14 is a graph showing the pressing temperature of an anisotropic conductive film, the internal temperature of a housing cover portion, and the temperature of a pressing unit.

FIG. 8 is a flowchart of an embodiment of a method of manufacturing a display device, FIG. 9 is a perspective view showing an embodiment of a target panel 100, a target substrate 300, and an anisotropic conductive film 200 of a display device, FIG. 10A is a cross-sectional view taken along the line X-X" of FIG. 9, FIG. 10B is an enlarged cross-sectional view of portion A of FIG. 10A, FIGS. 11 to 13 are cross-sectional views of embodiments of processes in a method of manufacturing a display device, and FIG. 14 is a graph showing the pressing temperature of an anisotropic conductive film 200, the internal temperature of a housing cover portion, and the temperature of a pressing unit 40.

In the graph of FIG. 14, the horizontal axis represents duration time in seconds (sec) of a bonding process, and the vertical axis represents temperature in Celsius (° C.) in the corresponding area. In FIG. 14, 0 sec refers to time at which the pressing unit 40 and the first housing cover HC1 are in contact with the target substrate and the target panel. The numerical values shown in the graph of FIG. 14 are illustrative, and may be changed depending on the thermal energy provided from the heating unit 30, the constituent material of the anisotropic conductive film 200, and the shape of the display device manufacturing apparatus 10.

When the target panel 100 and the target substrate 300 are bonded through the anisotropic conductive film 200, finally, a touch panel of a display device and a touch printed circuit board attached to the touch panel may be provided or formed. The touch panel may include a plurality of touch electrodes. The plurality of touch electrodes may include driving electrodes to which driving signals are applied, and adjacent sensing electrodes forming a mutual capacitance by the driving electrodes. The sensing electrodes may transmit sensing signals including a mutual capacitance value to the touch printed circuit board.

The driving electrodes and the sensing electrodes may be electrically connected to the touch printed circuit board through a driving signal line and a sensing signal line, respectively. The signal wiring PAD of the above-described target panel 100 may be the driving signal line and the sensing signal line. The driving signal line and the sensing signal line may constitute touch pads as the signal wiring PAD having an increased width in an area where the touch printed circuit board is attached. The touch pads may be connected to a lead wiring LE of the touch printed circuit board as the target substrate 300 through the anisotropic conductive film 200.

The anisotropic conductive film 200, as shown in FIG. 10B, may include a resin film 210 and a conductive ball 230 provided in plurality (e.g., a plurality of conductive balls 230) which are dispersed in the resin film 210. Each of the conductive balls 230 may have a structure in which an outer surface of a polymer particle is coated with a conductive material or metal such as nickel (Ni) or gold (Au). The resin film 210 may include a thermosetting resin or a thermoplastic resin.

The anisotropic conductive film 200 is disposed between the signal wiring PAD and the lead wiring LE to be in contact with the upper surface of the signal wiring PAD and the lower surface of the lead wiring LE. The anisotropic conductive film 200 may be in direct contact with a portion of a surface of a first base film 101 and a second base film 301 which is exposed by the signal wiring PAD and the lead wiring LE, respectively. Moreover, the anisotropic conductive film 200 may cover the side surfaces of the signal wiring PAD and the lead wiring LE, in addition to exposed portions of the surfaces of the first base film 101 and the second base film 301 which face each other.

The conductive balls 230 of the anisotropic conductive film 200 may serve to connect the signal wiring PAD and the lead wiring LE in an area where the signal wiring PAD overlaps the lead wiring LE (e.g., an overlapping area).

Although the signal wiring PAD is described as including touch pads of the touch panel, and the lead wiring LE is a lead wiring of the touch printed circuit board, the invention is not limited thereto. The signal wiring PAD may include display panel pads of a display panel, and the lead wiring LE may be a lead wiring of a display printed circuit board which is attached to the display panel.

The signal wiring PAD may be disposed on a first base film 101 of a target panel 100, and the lead wiring LE may be disposed on a second base film 301 of a target substrate 300. The signal wiring PAD may be provided in plurality (e.g., a plurality of signal wirings PAD) and the lead wiring LE may be provided in plurality (e.g., a plurality of lead wirings LE). The signal wirings PAD and the lead wirings LE may be arranged along a direction, e.g., horizontal in FIG. 10A.

Referring to FIG. 8, a target panel 100, a target substrate 300, and an anisotropic conductive film 200 disposed between the target panel 100 and the target substrate 300, are provided (S10). Since details thereof have been described above, a redundant thereof will be omitted.

Figure 11:
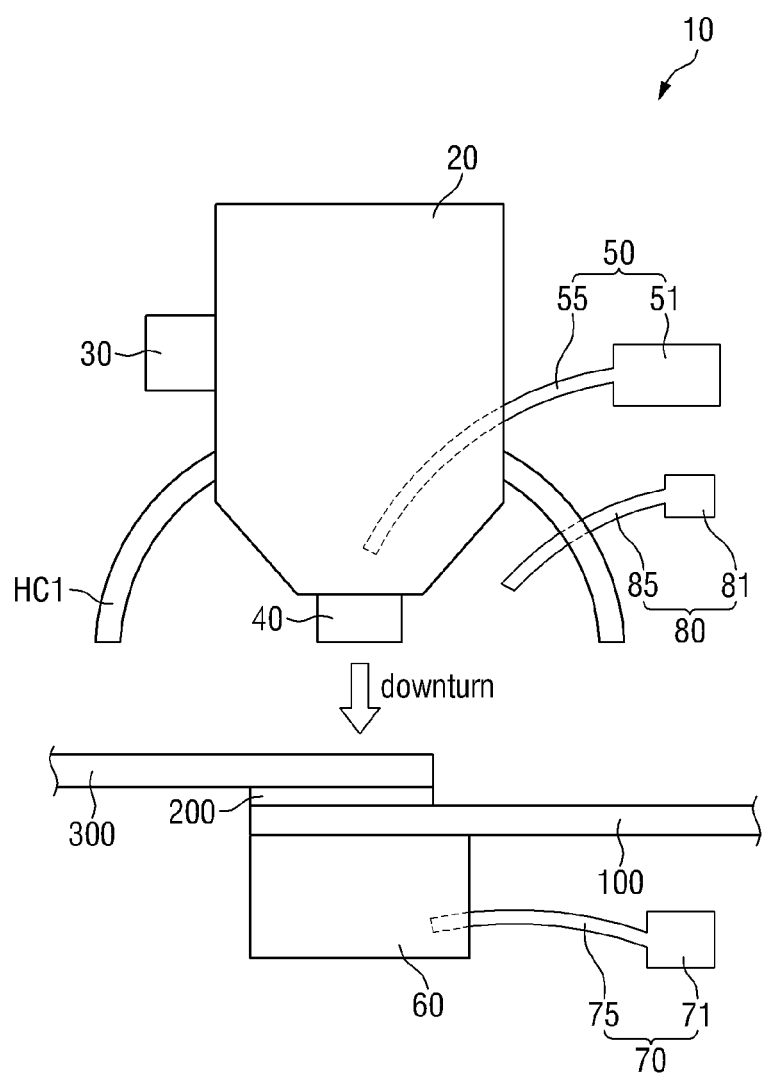
FIGS. 11 to 13 are cross-sectional views of an embodiment of processes of a method of manufacturing a display device.

Referring to FIG. 11, the display device manufacturing apparatus 10 is descended along the thickness direction (e.g., 'downward'). As described above, the first housing cover HC1 connected to the body 20 of the display device manufacturing apparatus 10 may be descended together with the body 20 along the thickness direction.

Referring to FIGS. 8 and 12, the target panel 100 and the target substrate 300 are attached to each other through the anisotropic conductive film 200 (S20).

In attaching the target panel 100 and the target substrate 300 to each other, the target panel 100 and the target substrate 300 may be attached to each other by applying heat and pressure to the target panel 100, the target substrate 300, and the anisotropic conductive film 200 using the display device manufacturing apparatus 10.

Specifically, as described above, the heating unit 30 of the display device manufacturing apparatus 10 may apply thermal energy to the body 20. The heating unit 30 may generate the thermal energy according to a reference value set in advance to generate the thermal energy.

The pressing unit 40 may apply heat and pressure directly to the target panel 100 and the target substrate 300 to at least partially melt the anisotropic conductive film 200 provided between the target panel 100 and the target substrate 300 and press the anisotropic conductive film 200 along the thickness direction, thereby bonding the overlying object of the target substrate 300 and the underlying object of the target panel 100.

Further, the attaching the target panel 100 and the target substrate 300 to each other may include attaching the signal wiring PAD of the target panel 100 to the lead wiring LE of the target substrate 300 through the anisotropic conductive film 200.

The first housing cover HC1 covers the anisotropic conductive film 200 (S30).

Specifically, the covering the anisotropic conductive film 200 with the first housing cover HC1 may include covering an entirety of the bonding area of the target substrate 300, the target panel 100, and the anisotropic conductive film 200 during a bonding process, as described above. Specifically, as described above, the covering of the entirety of the bonding area of the target substrate 300, the target panel 100, and the anisotropic conductive film 200 during a bonding process may include contacting the lower end of the first housing cover HC1 with the target substrate 300 and the target panel 100.

A bonding area of the target substrate 300, the target panel 100 and the anisotropic conductive film 200 as target objects, may respectively include a planar area at which one target object among these target objects is coupled to another one of the target objects. Referring to FIG. 12, the bonding area of the target substrate 300, the target panel 100 and the anisotropic conductive film 200 may correspond to a dimension of the pressing unit 40, without being limited thereto. In an embodiment, the bonding area of the target substrate 300, the target panel 100 and the anisotropic conductive film 200 may correspond to a dimension of the anisotropic conductive film 200 which is common to both the target substrate 300 and the target panel 100

The contacting the lower end of the first housing cover HC1 with each of the target substrate 300 and the target panel 100 may provide an internal space surrounded or defined by the first housing cover HC1, the target substrate 300, the target panel 100, and the anisotropic conductive film 200. That is, covering the anisotropic conductive film 200 which is between the target panel 100 and the target substrate 300, with the first housing cover HC1, defines an internal space to which the anisotropic conductive film 200 is exposed. Referring to FIG. 12, a distal end of the third connection portion 85 is extended into the internal space of the first housing cover HC1 from outside thereof.

A temperature of the internal space of the first housing cover HC1 is measured (S40).

The measuring the temperature of the internal space of the first housing cover HC1 may include measuring the saturation temperature of the internal space of the first housing cover HC1.

As described above, when thermal energy is introduced into the internal space through the pressing unit 40 of the display device manufacturing apparatus 10, the thermal energy of the body 20 and the pressing unit 40 located in the internal space is discharged through the atmosphere of the internal space, the target substrate, and the target panel, so that the temperature of the body 20 measured by the first temperature measuring unit 50 is lowered, whereas the temperature of atmosphere in the internal space and the temperature of the anisotropic conductive film 200 are raised.

The temperature of atmosphere in the internal space and the temperature of the anisotropic conductive film 200 may be increased for a predetermined period of time, and then may reach a saturation temperature after the predetermined period of time. Generally, the saturation temperature of the atmosphere of the internal space may be higher than that of the anisotropic conductive film 200 because the atmosphere in the internal space is located closer to the pressing unit 40 than the anisotropic conductive film 200.

The saturation temperature of the atmosphere of the internal space and the saturation temperature of the anisotropic conductive film 200 may be empirically determined.

As shown in FIG. 14, the saturation temperature of the internal space may be in a range of about 200° C. to about 220° C., and the saturation temperature of the anisotropic conductive film 200 may be in a range of about 150° C. to about 160° C. A saturation temperature may indicate a maximum temperature or a temperature which is maintained for a period of time.

Specifically, the temperature of the internal space may increase after the first housing cover HC1 contacts the target substrate 300 and the target panel 100, and then may reach the saturation temperature after about 10 seconds.

According to experimentally determined data, similarly to the temperature of the internal space, the temperature of the anisotropic conductive film 200 may increase after the first housing cover HC1 contacts the target substrate 300 and the target panel 100, and then may reach the saturation temperature after about 10 seconds.

Before about 10 seconds at which the temperature of the anisotropic conductive film 200 and the temperature of the internal space reach the saturation temperature, a difference in temperature between the internal space and the anisotropic conductive film 200 may gradually decrease. After about 10 seconds at which the temperature of the anisotropic conductive film 200 and the temperature of the internal space reach the saturation temperature, the temperature of the internal space and the anisotropic conductive film 200 may be substantially constant.

Referring to FIG. 13, the display device manufacturing apparatus 10 is ascended along the thickness direction (e.g., 'upward'). As described above, the first housing cover HC1 connected to the body 20 of the display device manufacturing apparatus 10 may be ascended together with the body 20 along the thickness direction.

Therefore, when the temperature of atmosphere in the internal space surrounded or defined by the first housing cover HC1, the target substrate 300, the target panel 100, and the anisotropic conductive film 200 reaches the saturation temperature, the temperature of the anisotropic conductive film 200 may also reach the saturation temperature, such that the saturation temperature of the anisotropic conductive film 200 during thermal pressing ("thermocompression" in FIG. 12) may be tracked by measuring the temperature of the atmosphere in the internal space in real time on the basis of the experimentally determined data.

The measuring the temperature of the internal space of the first housing cover HC1 may further include increasing the heat applied to the target substrate 300 when the saturation temperature of the internal space of the first housing cover HC1 is lower than a reference saturation temperature. The increasing the heat applied to the target substrate 300 may be performed by increasing the reference value of the heating unit 30. The reference saturation temperature for controlling the temperature of the internal space may correspond to the reference pressing temperature range at which appropriate melting of the anisotropic conductive film 200 is provided and which minimizes excessive power consumption.

The measuring the temperature of the internal space of the first housing cover HC1 may further include decreasing the heat applied to the target substrate 300 when the saturation temperature of the internal space of the first housing cover HC1 is higher than the reference saturation temperature.

The decreasing the heat applied to the target substrate 300 may be performed by decreasing the reference value of the heating unit 30.

The measuring of the temperature of the internal space of the first housing cover HC1 may further include terminating bonding of the target panel 100 and the target substrate 300 to each other when the saturation temperature of the internal space of the first housing cover HC1 is maintained for a predetermined period of time.

In an embodiment, a target object includes layers (e.g., the target panel 100, the anisotropic conductive film 200 and the target substrate 300) which are bondable to each other. Engagement of the first housing cover HC1 with the target object defines an internal space of the first housing cover HC1 having a temperature defined by heat transferred from the pressing unit 40 and the body 20 at the internal space. Measurement by the apparatus 10, of the temperature of the internal space, controls bonding of the layers of the target object to each other.

That is, since the saturation temperature of the anisotropic conductive film 200 during thermal pressing may be indirectly measured by measuring the saturation temperature of atmosphere in the internal space in real time during a bonding process, weakening of the bonding force between the target substrate 300 and the target panel 100 occurring when the pressing temperature at which the anisotropic conductive film 200 is thermally pressed by the display device manufacturing apparatus 10 during the bonding of the target substrate 300 and the target panel 100 to each other is lower than the reference pressing temperature range, is reduced or effectively prevented. Additionally, since the saturation temperature of the anisotropic conductive film 200 during thermal pressing may be indirectly measured by measuring the saturation temperature of atmosphere in the internal space in real time during a bonding process, excessive power consumption occurring when the pressing temperature at which the anisotropic conductive film 200 is thermally pressed by the display device manufacturing apparatus 10 during the bonding of the target substrate 300 and the target panel 100 to each other is higher than the reference pressing temperature range, is reduced or effectively prevented.

According to one or more embodiment of the display device manufacturing apparatus, the pressing temperature of an anisotropic conductive film 200 can be measured in real time during a bonding process, and thus bonding reliability between target objects (e.g., the target substrate 300 and the target panel 100) can be improved.

The effects of the invention are not limited by the foregoing, and other various effects are anticipated herein.

Although embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for manufacturing a display device, comprising:
    a heater which generates heat;
    a pressing member at which the apparatus directly contacts a target object of the display device to transfer the heat to the target object;
    a body which connects the heater and the pressing member to each other, and through which the heat from the heater is provided to the pressing member;
    a first housing cover extended from the body to define an internal space between the first housing cover, and each of the pressing member and the body, respectively; and
    a temperature measuring member connected to the internal space,
    wherein
    the target object includes layers which are bondable to each other,
    engagement of the first housing cover with the target object disposes the internal space surrounded by the first housing cover, together with the pressing member, the body and the target object,
    the internal space which is surrounded by the first housing cover, together with the pressing member, the body and the target object, has a temperature, and
    measurement by the temperature measuring member, of the temperature of the internal space, controls bonding of the layers of the target object.

2. The apparatus of claim 1, further comprising:
    a lower support facing the body with the pressing member therebetween; and
    a second housing cover extended from the lower support to surround the lower support in the plan view.

3. The apparatus of claim 1, wherein the first housing cover includes a transparent material.

4. The apparatus of claim 1, wherein
    the heat from the heater has a temperature, and
    a material of the first housing cover has a melting point higher than the temperature of the heat from the heater.

5. The apparatus of claim 1, wherein the first housing cover includes:
    a first sub-housing cover extended from the body, and
    a second sub-housing cover extended from an end of the first sub-housing cover to be spaced apart from the body with the first sub-housing cover therebetween,
    wherein the first sub-housing cover and the second sub-housing cover include different materials from each other.

6. The apparatus of claim 5, wherein
    the engagement of the first housing cover with the target object contacts the second sub-housing cover with the target object, and
    rigidity of the second sub-housing cover is lower than rigidity of the first sub-housing cover.

7. The apparatus of claim 1, wherein the first housing cover is extended directly from the body.

8. The apparatus of claim 1, wherein the first housing cover is provided as a separate member from the body and attachable to the body to extend therefrom and surround the pressing member and the body in the plan view.

9. A method of manufacturing a display device, comprising:
    providing a target object comprising an anisotropic conductive film of the display device between a target panel of the display device and a target substrate of the display device;
    providing the target object exposed to an internal space of an apparatus for manufacturing the display device, by:
        providing a heated pressing member of the apparatus in direct contact with the target object, to transfer heat to the target object, and
        providing a housing cover of the apparatus, which extends from the heated pressing member, engaged with the target object, to dispose the internal space surrounded by the housing cover together with the heated pressing member and the target object,
        wherein the internal space which is surrounded by the housing cover together with the heated pressing member and the target object, has a temperature;
    attaching the target panel to the target substrate, through the anisotropic conductive film; and
    measuring the temperature of the internal space which is surrounded by the housing cover together with the target object, to control attachment of the target panel to the target substrate through the anisotropic conductive film.

10. The method of claim 9, wherein
the attaching the target panel to the target substrate includes applying heat and pressure to the target object using the heated pressing member of the apparatus for manufacturing the display device.

11. The method of claim 10, wherein the measuring the temperature of the internal space surrounded by the housing cover together with the heated pressing member and the target object includes defining a saturation temperature of the internal space.

12. The method of claim 11, wherein
the temperature of the internal space surrounded by the housing cover together with the heated pressing member and the target object, which is maintained for a period of time, defines the saturation temperature, and
the measuring the temperature of the internal space surrounded by the housing cover together with the heated pressing member and the target object includes terminating the attaching of the target panel to the target substrate when the temperature reaches the saturation temperature.

13. The method of claim 11, wherein the measuring the temperature of the internal space surrounded by the housing cover together with the heated pressing member and the target object includes increasing the heat which is applied to the target substrate when the saturation temperature is lower than a reference saturation temperature at which the target panel, the target substrate and the anisotropic conductive film are attachable to each other.

14. The method of claim 11, wherein the measuring the temperature of the internal space surrounded by the housing cover together with the heated pressing member and the target object includes decreasing the heat which is applied to the target substrate when the saturation temperature is higher than a reference saturation temperature at which the target panel, the target substrate and the anisotropic conductive film are attachable to each other.

15. The method of claim 9, wherein the attaching the target panel to the target substrate includes attaching a signal wiring of the target panel to a lead wiring of the target substrate, through the anisotropic conductive film.

16. The method of claim 15, wherein the providing of the housing cover of the apparatus engaged with the target object includes contacting the housing cover with both the target panel and the target substrate.

17. The method of claim 16, wherein
the housing cover includes an upper housing cover and a lower housing cover facing each other, and
the contacting the housing cover with both the target panel and the target substrate includes contacting the upper housing cover with the target substrate and contacting the lower housing cover with the target panel.

18. The method of claim 17, wherein
the upper housing cover includes a first sub-housing cover and a second sub-housing cover which is extended from an end of the first sub-housing cover to define an end of the upper housing cover, and
the contacting the housing cover with both the target panel and the target substrate directly contacts the upper housing cover with the target substrate at the second sub-housing cover.

19. The method of claim 18, wherein rigidity of the second sub-housing cover at which the upper housing cover is directly contacted with the target substrate is lower than rigidity of the first sub-housing cover.

20. The method of claim 16, wherein the housing cover includes a transparent material.

21. An apparatus for manufacturing a display device, comprising:
a heated pressing body which is moveable relative to a target object of a display device which includes layers bondable to each other, and provides heat and pressure to the target object to bond the layers;
a housing which protrudes outwardly from the heated pressing body and is moveable together with the heated pressing body;
an internal space defined between the heated pressing body and the housing; and
a temperature measuring member connected to the internal space which is defined between the heated pressing body and the housing,
wherein
direct contact of the heated pressing body to the target object defines the internal space surrounded by the heated pressing body, together with the housing and the target object,
the internal space which is surrounded by the heated pressing body, together with the housing and the target object, has a temperature, and
measurement by the temperature measuring member, of the temperature of the internal space surrounded by the heated pressing body together with the housing and the target object, controls providing of the heat to the target object by the heated pressing body.

\* \* \* \* \*